United States Patent
Sakaguchi

(10) Patent No.: US 9,589,926 B2
(45) Date of Patent: Mar. 7, 2017

(54) METHOD OF MANUFACTURING SEMICONDUCTOR DEVICE

(71) Applicant: Fuji Electric Co., Ltd., Kanagawa (JP)

(72) Inventor: Shoji Sakaguchi, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 14/931,772

(22) Filed: Nov. 3, 2015

(65) Prior Publication Data

US 2016/0181224 A1 Jun. 23, 2016

(30) Foreign Application Priority Data

Dec. 17, 2014 (JP) .................... 2014-254931

(51) Int. Cl.
- *B23K 26/00* (2014.01)
- *H01L 23/00* (2006.01)
- *H01L 25/065* (2006.01)
- *H01L 25/00* (2006.01)

(52) U.S. Cl.
CPC .......... *H01L 24/83* (2013.01); *H01L 25/0657* (2013.01); *H01L 25/50* (2013.01); *H01L 2224/83203* (2013.01); *H01L 2224/83385* (2013.01); *H01L 2224/83894* (2013.01); *H01L 2924/3511* (2013.01)

(58) Field of Classification Search
CPC .... H01L 25/18; H01L 21/67092; B23K 26/00
See application file for complete search history.

(56) References Cited

U.S. PATENT DOCUMENTS

| | | | |
|---|---|---|---|
| 2003/0082356 A1* | 5/2003 | Suemasu | C23C 2/00 428/209 |
| 2004/0256730 A1 | 12/2004 | Hirano et al. | |
| 2005/0073048 A1* | 4/2005 | Bojkov | H01L 24/05 257/737 |
| 2005/0170612 A1 | 8/2005 | Miyanari et al. | |
| 2007/0018313 A1* | 1/2007 | Gomyo | H01L 21/568 257/723 |
| 2013/0192754 A1* | 8/2013 | Dukkipati | H01L 21/02 156/308.2 |
| 2014/0264762 A1* | 9/2014 | Rajoo | H01L 23/10 257/618 |

FOREIGN PATENT DOCUMENTS

| | | |
|---|---|---|
| JP | 2005-019798 A | 1/2005 |
| JP | 2005-191550 A | 7/2005 |
| JP | 2007-317964 A | 12/2007 |
| JP | 2011-219503 A | 11/2011 |
| JP | 2011-222541 A | 11/2011 |

* cited by examiner

*Primary Examiner* — Mohammad Choudhry
(74) *Attorney, Agent, or Firm* — Chen Yoshimura LLP

(57) ABSTRACT

A method of manufacturing a semiconductor device that includes: preparing a pair of substrates that respectively include a device structure on one primary surface or another primary surface thereof; stacking the substrates so that said one primary surfaces face each other, exposing said another surfaces to the outside, and fixing entire peripheral outer edges of the substrates that have been stacked to each other; and thereafter, plating said exposed another primary surfaces of the stacked and fixed substrates.

9 Claims, 15 Drawing Sheets

METHOD OF MANUFACTURING SEMICONDUCTOR DEVICE

BACKGROUND OF THE INVENTION

Technical Field

The present invention relates to a method of manufacturing a semiconductor device.

Background Art

Semiconductor devices include semiconductor chips on which IGBTs (insulated gate bipolar transistors), FWDs (free-wheeling diodes), or the like are formed, and are widely used as power conversion devices and the like. This kind of semiconductor chip is obtained by individually dividing a semiconductor substrate on which semiconductor elements have been formed. In addition, electrodes of the semiconductor elements on the front surface side of the semiconductor chip are bonded to external terminals via solder. Thus, a metal layer with good solder wettability (a nickel layer, for example) is formed via plating on the electrodes (see Patent Document 1, for example).

When a metal layer (plating layer) is formed via plating on the front surface (device surface) side of the semiconductor substrate, the plating solution may spread to the rear surface of the semiconductor substrate. As a result, the plating layer that was deposited on the rear surface of the semiconductor substrate will detach and mix with the plating solution inside the plating tank. This plating layer in the plating solution becomes a nucleus upon which plating material deposits, and thus the concentration of plating material within the plating solution decreases.

In addition, in order to decrease energy loss and increase heat dissipation in power devices, technology has been proposed in which the semiconductor substrate is made thinner. However, when the thickness of a semiconductor wafer with a diameter of 6 inches is decreased to approximately 100 μm, for example, problems such as cracking and warping of the semiconductor substrate occur.

Therefore, methods of manufacturing have been proposed in which the semiconductor substrate is supported by providing a support plate via an adhesive layer to the rear surface of the semiconductor substrate (see Patent Documents 2 and 3, for example). Through this method, by providing a support plate on the rear surface of the semiconductor substrate, warping of the front surface of the semiconductor substrate can be corrected. When plating a semiconductor substrate supported by a support plate in this manner, it is possible to prevent the plating solution from spreading to the rear surface of the semiconductor substrate and form a plating layer on only the front surface side of the semiconductor element.

RELATED ART DOCUMENTS

Patent Documents

Patent Document 1: Japanese Patent Application Laid-Open Publication No. 2005-019798
Patent Document 2: Japanese Patent Application Laid-Open Publication No. 2005-191550
Patent Document 3: Japanese Patent Application Laid-Open Publication No. 2007-317964

SUMMARY OF THE INVENTION

In the methods disclosed in Patent Documents 2 and 3, pores are formed in the support plate. These pores pass through the surface of the support plate that is used to bond to the semiconductor substrate. When the support plate is removed from the adhesive layer, the adhesive layer is melted by inserting a prescribed chemical solution into the pores. However, when strongly acidic or strongly alkaline chemical solutions used during plating enter the pores, there is the possibility that the adhesive layer will melt and the support plate will become detached from the semiconductor substrate. When this happens, it is no longer possible to prevent the plating solution from spreading to the rear surface of the semiconductor substrate. Furthermore, it becomes necessary to detach the adhesive layer after plating is completed, which makes the manufacturing process more complicated. In addition, there are instances in which it is difficult to reliably detach the adhesive layer.

Another problem that can occur is the thickness distribution of the plating not being even across the surface. When the semiconductor substrate is supported by providing a support plate, the front surface of the support plate is not plated; thus, deviations may occur in the concentration distribution of precipitation ions within the plating solution, causing unevenness in the thickness distribution of the plating across the front surface of the semiconductor substrate and variations among the thickness distributions of multiple semiconductor substrates.

A substrate made of glass, a silicon wafer, a ceramic, or the like can be used as the support plate. In order to correct warping, a support plate with a thickness of 0.5 mm to 1 mm is used. When a support plate is provided, the thickness of the semiconductor substrate increases, which narrows the gap between adjacent semiconductor substrates. As a result, the plating solution does not flow smoothly, and the thickness distribution of the plating becomes more uneven.

Accordingly, the present invention is directed to a semiconductor device and method that substantially obviate one or more of the problems due to limitations and disadvantages of the related art.

An object of the present invention is to provide a method of manufacturing a semiconductor device in which a metal layer can be formed on only the front surface of a semiconductor substrate.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a method of manufacturing a semiconductor device, including: preparing a pair of substrates that respectively include a device structure on one primary surface or another primary surface thereof; stacking the substrates so that said one primary surfaces face each other, exposing said another surfaces to the outside, and fixing entire peripheral outer edges of the substrates that have been stacked to each other; and thereafter, plating said exposed another primary surfaces of the stacked and fixed substrates.

According to the technology disclosed in the present application, plating can be appropriately performed on another primary surface of a substrate.

It is to be understood that both the foregoing general description and the following detailed description are exemplary and explanatory, and are intended to provide further explanation of the invention as claimed.

DETAILED DESCRIPTION OF EMBODIMENTS

The embodiments will be described hereafter with reference to the drawings.

<Embodiment 1>

A method of manufacturing a semiconductor device of Embodiment 1 will be described using FIGS. 1A to 1F.

FIGS. 1A to 1F illustrate a method of manufacturing a semiconductor device of Embodiment 1 (in instances in which the device surface of the semiconductor substrate warps upward in a protruding manner).

Figure 1A:
FIGS. 1A to 1F illustrate a method of manufacturing a semiconductor device of Embodiment 1 (in instances in which a device surface of a semiconductor substrate warps upward in a protruding manner).
Figure 1B:
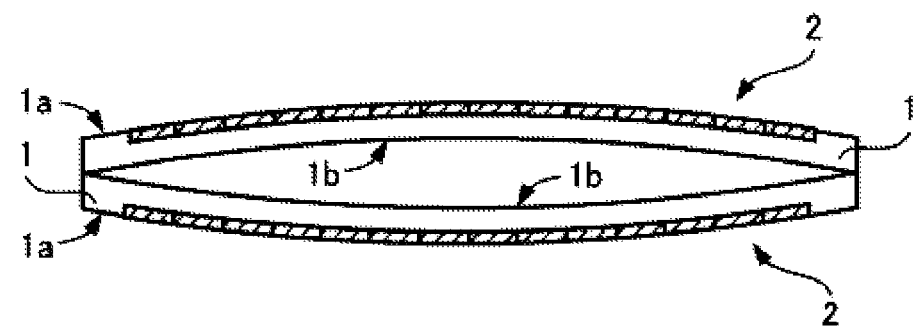
Figure 1C:
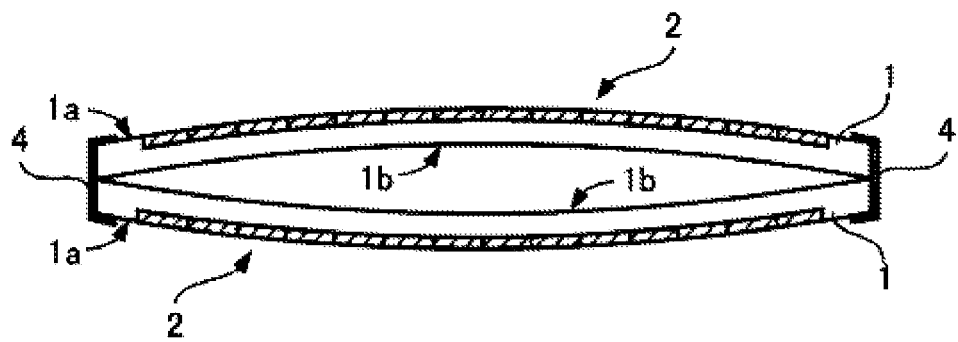
Figure 1D:
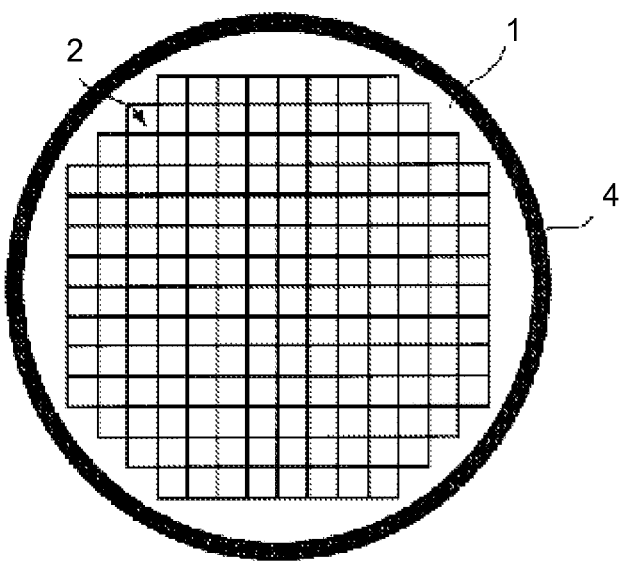

FIGS. 1A to 1C, 1E, and 1F are side views of the semiconductor substrates, and FIG. 1D is a top view of the semiconductor substrates shown in FIG. 1C.

A semiconductor substrate 1 includes a device structure 2 of a semiconductor element on a front surface 1a. The front surface 1a on which the device structure 2 is provided is also referred to as the device surface. Afterwards, on the semiconductor substrate 1 that includes the device structure 2, a metal film or the like is formed on both the device structure 2 and a rear surface 1b of the semiconductor substrate 1. The semiconductor substrate 1 is then individually divided into semiconductor chips.

As shown in FIG. 1A, when such a semiconductor substrate 1 is thin with a thickness of approximately 30 µm to 200 µm, the device surface of the semiconductor substrate 1 may warp upwards in a protruding manner. When a warped semiconductor substrate 1 is plated, the semiconductor substrate 1 is fixed by attaching a specialized jig to the rear surface 1b of the semiconductor substrate 1, for example. In this way, plating solution is prevented from spreading to the rear surface 1b of the semiconductor substrate 1. However, in cases where the thickness of the semiconductor substrate 1 is approximately 30 µm to 200 µm, when the specialized jig is attached to the rear surface 1b of the semiconductor substrate 1, there is the possibility that the semiconductor substrate 1 will be damaged by the specialized jig. In addition, depending on how the semiconductor substrate 1 is handled, there is the possibility that the semiconductor substrate 1 will break or crack. Thus, there is the possibility that a semiconductor substrate 1 with a thickness of 30 µm to 200 µm may be damaged.

As a countermeasure, a method of appropriately plating such a semiconductor substrate 1 without causing damage to the substrate will be explained in Embodiment 1.

First, as shown in FIG. 1B, a pair of the semiconductor substrates 1 are prepared, and the semiconductor substrates 1 are stacked such that the rear surfaces 1b of the substrates face each other.

Next, the outer edges of the semiconductor substrates 1 that have been stacked such that the rear surfaces 1b face each other are secured to each other. As shown in FIG. 1D, a fixing member 4 that has an adhesive layer is attached to the outer edges of the stacked semiconductor substrates 1, for example. As shown in FIG. 1C, the outer edges of the semiconductor substrates 1 can be fixed via the fixing member 4. It is also possible to attach the outer edges of the semiconductor substrates 1 by using a bonding member, for example.

Figure 1E:
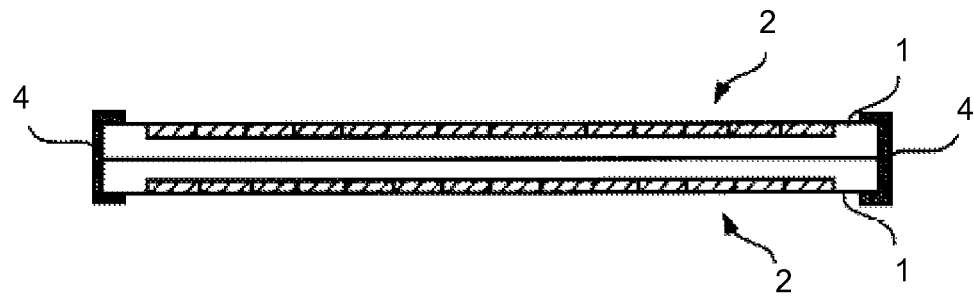
Figure 1F:
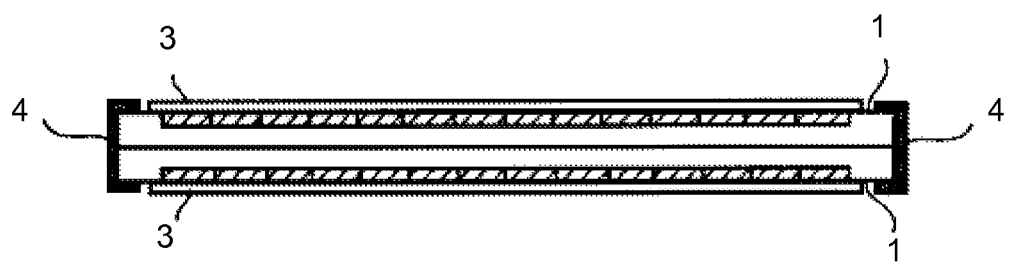

In this way, as shown in FIG. 1E, by fixing the outer edges of a pair of semiconductor substrates 1, the semiconductor substrates 1 can be prevented from warping, and the flatness of the pair of semiconductor substrates 1 is improved. As shown in FIG. 1F, once the flatness of the semiconductor substrates 1 is improved, when plating is performed, a plating layer 3 is appropriately formed on the front surface 1a that includes the device structure 2.

After this, the pair of semiconductor substrates 1 are separated by detaching the fixing member 4 from the semiconductor substrates 1. A metal film or the like is formed on the respective rear surfaces 1b of the separated semiconductor substrates 1, and, by individually dividing the substrates, semiconductor chips are obtained.

FIGS. 1A to 1F show a case in which the device surfaces of the semiconductor substrates 1 warp upward in a protruding manner, but the present invention is not limited to such cases. The method described above can also be used to planarize semiconductor substrates 1 in which the device surfaces of the semiconductor substrates 1 warp downward in a recessed manner.

Therefore, a case in which the semiconductor substrates 1 warp downwards in a recessed manner will be explained next using FIGS. 2A to 2C.

Figure 2A:
FIGS. 2A to 2C illustrate a method of manufacturing a semiconductor device of Embodiment 1 (in which the device surface of the semiconductor substrate warps downward in a recessed manner).
Figure 2B:
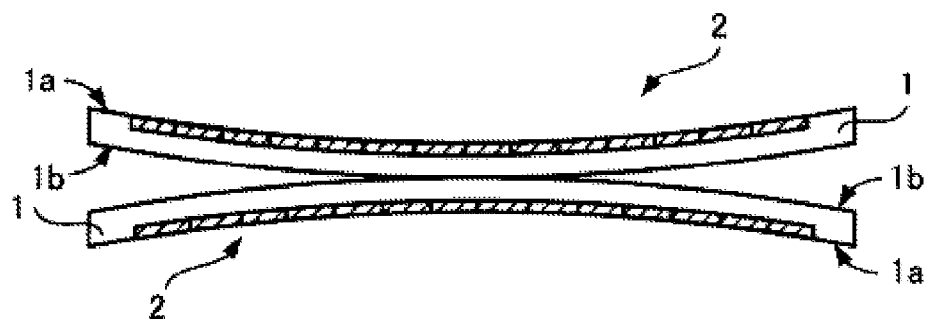
Figure 2C:
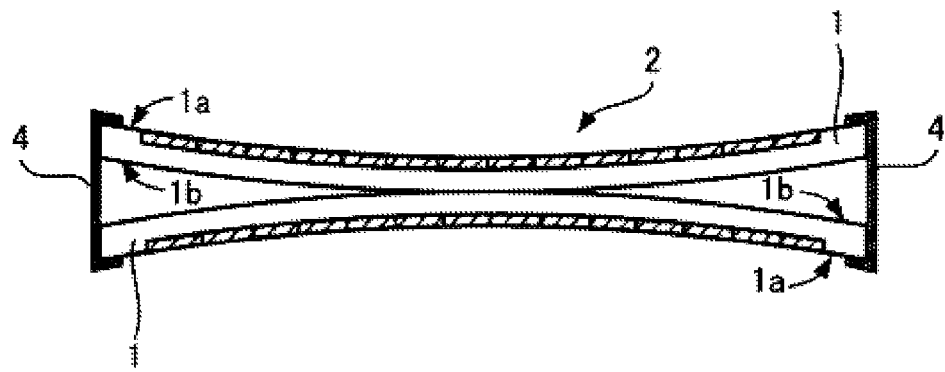

FIGS. 2A to 2C show a method of manufacturing a semiconductor device of Embodiment 1 (when the device surfaces of the semiconductor substrates warp downward in a recessed manner).

FIGS. 2A to 2C are side views of the semiconductor substrates.

The manufacturing method of a semiconductor device for a case such as that shown in FIG. 2A, in which a semiconductor substrate 1 warps downward in a recessed manner, will be explained next.

As in the case mentioned above, a pair of semiconductor substrates 1 are prepared and, as shown in FIG. 2B, stacked so that the rear surfaces 1b of the semiconductor substrates 1 face each other.

Next, as shown in FIG. 2C, the outer edges are fixed by attaching the fixing member 4 along the outer edges of the semiconductor substrates 1 that have been stacked so that the rear surfaces 1b face each other.

As shown in FIG. 1E, even in cases in which the semiconductor substrates 1 warp downward in a recessed manner, by fixing the outer edges of the semiconductor substrates 1 along the outer edges in a manner similar to that used for the case shown in FIGS. 1A to 1F in which the semiconductor substrates 1 warp upward in a protruding manner, warping of the semiconductor substrates 1 can be suppressed and the flatness of the pair of semiconductor substrates 1 can be improved.

After this, as shown in FIG. 1F, when plating similar to that illustrated in FIGS. 1A to 1F is performed, a plating layer 3 can be appropriately formed on the front surface 1a that includes the device structure 2.

In this way, a pair of semiconductor substrates 1 that respectively include a device structure 2 on the front surface 1a can be prepared. The semiconductor substrates 1 are stacked so that the rear surfaces 1b thereof face each other, and the outer edges of the stacked semiconductor substrates 1 are fixed. By so doing, warping of the front surface of the semiconductor substrates 1 is suppressed and the flatness of the semiconductor substrates 1 is improved. In addition, since the device structure 2 is respectively formed on each of the front surfaces 1a of the pair of semiconductor substrates 1, the same amount of plating is deposited on each of the front surfaces 1a. Therefore, when such semiconductor substrates 1 are plated, the plating can be performed without disruptions in the flow of the plating solution to the front surfaces 1a. Furthermore, the thickness distribution of the plating layer 3 formed on the respective front surfaces 1a is improved. In addition, the pair of semiconductor substrates 1 are stacked so that the rear surfaces 1b thereof face each other. Thus, plating layers 3 can be simultaneously formed on the respective front surfaces 1a of two semiconductor substrates 1, and plating solution can be prevented from spreading to the rear surfaces 1b of the semiconductor substrates 1. In addition, the fixing member 4 is attached to the outer edges of the pair of semiconductor substrates 1 along the outer edges. Thus, plating solution can be prevented from spreading between the stacked pair of semiconductor substrates 1. Therefore, the plating layer 3 can be appropriately and inexpensively formed on the semiconductor substrates 1, and productivity of the semiconductor device is improved.

This method of planarizing such semiconductor substrates 1 is not limited to the cases shown in FIGS. 1A to 1F and FIGS. 2A to 2C in which the semiconductor substrates 1 warp upward in a protruding manner or warp downward in a recessed manner, and can also be applied to cases in which the semiconductor substrates 1 have a wavy shape, for example. In addition, this method can also be applied to cases in which the protruding semiconductor substrates 1 shown in FIGS. 1A to 1F are stacked in the same direction and cases in which the recessed semiconductor substrates 1 shown in FIGS. 2A to 2C are stacked in the same direction.

In addition, this method can also be used in cases in which a FS (field stop) IGBT, another type of IGBT, a power MOSFET (metal oxide semiconductor field effect transistor), or an FWD is formed on the semiconductor substrates 1.

In Embodiment 1, a case was described in which the semiconductor substrates 1 respectively include the device structure 2 on the front surface side, the semiconductor substrates 1 are stacked so that the rear surfaces thereof face each other, and plating layers 3 are respectively formed on the front surface sides of the semiconductor substrates 1. The above-described method is not limited to such a case, however, and it is possible to stack the semiconductor substrates 1 such that the front surfaces face each other and then form the plating layers 3 on the rear surfaces in a manner similar to that described in Embodiment 1.

<Embodiment 2>

A semiconductor device of Embodiment 2 will be explained using FIGS. 3A and 3B.

Figure 3A:
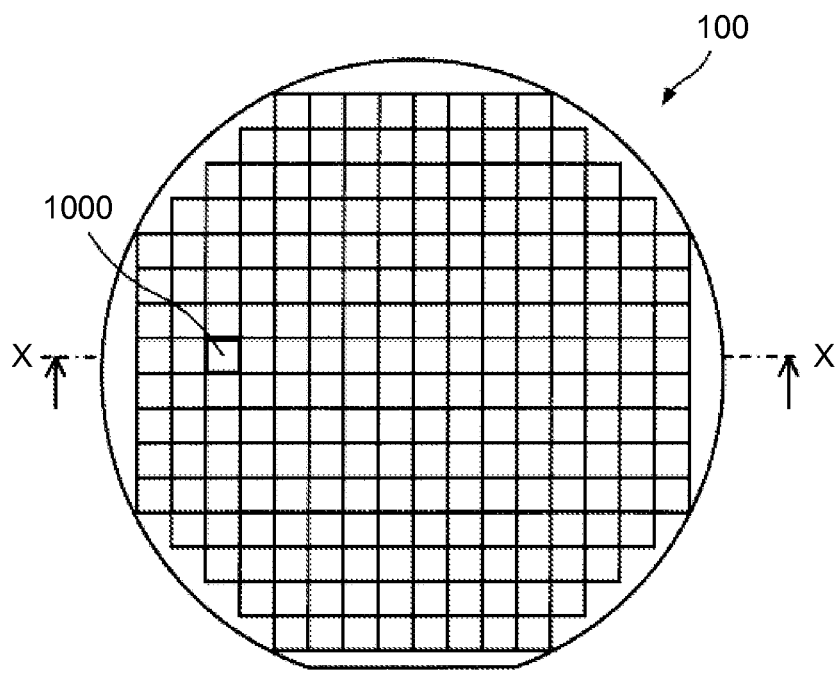
FIGS. 3A and 3B show a semiconductor device of Embodiment 2.
Figure 3B:
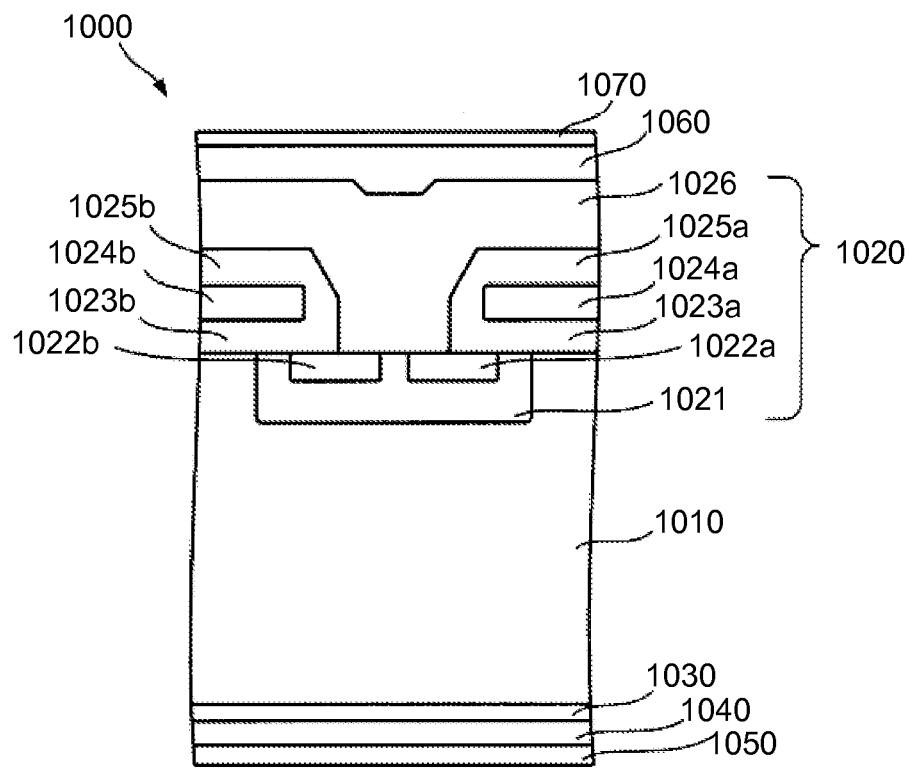

FIGS. 3A and 3B show a semiconductor device according to Embodiment 2.

FIG. 3A is a top view of a semiconductor substrate on which semiconductor devices (semiconductor chips) have been formed. FIG. 3B is a cross-section of a semiconductor device along the dashed-dotted line X-X in FIG. 3A.

As shown in FIG. 3A, a plurality of semiconductor devices 1000 are formed on a silicon wafer 100.

The semiconductor devices 1000 are field stop IGBTs. As shown in FIG. 3B, the semiconductor device 1000 includes a semiconductor substrate 1010, and a device structure 1020 formed on the front surface side of the semiconductor substrate 1010. The semiconductor device 1000 further includes on the rear surface side thereof: an n-buffer layer 1030; a p$^+$ collector layer 1040; and a collector electrode layer 1050. The semiconductor device 1000 further includes a nickel plating layer 1060 and a gold plating layer 1070 on the device structure 1020 of the semiconductor substrate 1010.

The semiconductor substrate 1010 is a floating zone substrate formed via the FZ method and is an n$^-$ drift layer in which a low concentration of n-type ions (phosphorus, for example) have been implanted, for example. Then n$^-$ drift layer functions as an active layer.

The device structure 1020 includes: a p$^+$ base region 1021; n$^+$ emitter regions 1022a, 1022b; a gate oxide layer 1023a, 1023b; a gate electrode layer 1024a, 1024b; an interlayer insulation layer 1025a, 1025b; and an emitter electrode layer 1026.

The p$^+$ base region 1021 is formed by implanting a high concentration of p-type ions (boron, for example) into the semiconductor substrate 1010, thereby introducing a p-type region.

The n$^+$ emitter regions 1022a, 1022b are formed by implanting a high concentration of n-type ions (phosphorus, for example) into the p$^+$ base region 1021, thereby introducing an n-type region.

The gate oxide layer 1023a, 1023b is formed of silicon oxide, for example.

The gate electrode layer 1024a, 1024b is formed on the gate oxide layer 1023a, 1023b, and is formed of a metal layer whose primary constituent is aluminum, for example.

The interlayer insulation layer 1025a, 1025b is formed on the gate electrode layer 1024a, 1024b, and is formed of silicon oxide, for example.

The emitter electrode layer 1026 is formed of a metal layer whose primary constituent is aluminum, for example. Aluminum-silicon is one example of an aluminum alloy used to form the emitter electrode layer 1026. In aluminum-silicon, the silicon content is between 0.5 wt % and 2 wt %, with less than or equal to 1 wt % being preferable. In addition, when the emitter electrode layer 1026 is made of aluminum-silicon, the adhesion between the emitter electrode layer 1026 and the semiconductor substrate 1010 increases, and occurrence of aluminum spikes that extend to the semiconductor substrate 1010 can be suppressed. The aluminum-silicon emitter electrode layer 1026 is formed via evaporation or sputtering, for example.

An n-type region and a p-type region, in which, in a manner similar to that mentioned above, n-type ions (phosphorus, for example) and a high concentration of p-type ions (boron, for example) are successively implanted, are introduced in the n-buffer layer 1030 and the $p^+$ collector layer 1040 formed on the rear surface side of the semiconductor substrate 1010 on which such a device structure 1020 is formed.

The collector electrode layer 1050 is formed of a plurality of metal layers (an aluminum layer, a titanium layer, a nickel layer, and a gold layer, for example) successively stacked on the front surface of the $p^+$ collector layer 1040. Before such metal layers are stacked, a natural oxide layer formed on the front surface of the $p^+$ collector layer 1040 is removed using dilute hydrofluoric acid.

With respect to the aluminum layer that forms one of the metal layers that makes up the collector electrode layer 1050, it is preferable that the layer be made of aluminum-silicon that has a silicon content of between 0.5 wt % and 2 wt %, with 1 wt % or less being more preferable. As mentioned above, by using such a structure, aluminum spikes can be prevented. Aluminum spikes are formed when aluminum spreads from the aluminum layer to the underlying semiconductor substrate 1010 during the formation of the aluminum layer or during heat treatment performed after the aluminum layer has been formed. When these aluminum spikes break through the p-n junction of the $p^+$ collector layer 1040 and the n-buffer layer 1030 on the rear surface side of the FS IGBT, problems with the electrical properties of the FS IGBT, such as an increase in the amount of current that is leaked, occur. By making the aluminum layer a layer of aluminum-silicon that contains silicon, aluminum spikes that extend to the underlying semiconductor substrate 1010 can be prevented.

The nickel layer, which is one of the metal layers that make up the collector electrode layer 1050, is subject to a high amount of film stress. To suppress the amount of stress, it is preferable that the nickel layer be formed relatively thin with a thickness of approximately 0.7 μm, for example.

The nickel layer and the gold layer formed on the nickel layer are melted by solder when solder is applied during mounting. Thus, the nickel layer is provided to solder bond an external terminal (not shown). Since adhesion between the solder and the aluminum layer (the aluminum-silicon layer) is poor, a titanium layer is provided between the aluminum layer and the nickel layer. The gold layer provided on the nickel layer prevents oxidation of the nickel layer.

The aluminum layer that forms a part of the collector electrode layer 1050 can be omitted. In addition, since the collector electrode layer 1050 is formed across the entire rear surface of the semiconductor substrate 1010, patterning is unnecessary. Therefore, since the plurality of metal layers can be continuously stacked, productivity can be increased by using evaporation or sputtering.

Next, a method of manufacturing such a semiconductor device 1000 will be described using FIGS. 4 and 5A to 5E.

Figure 4:
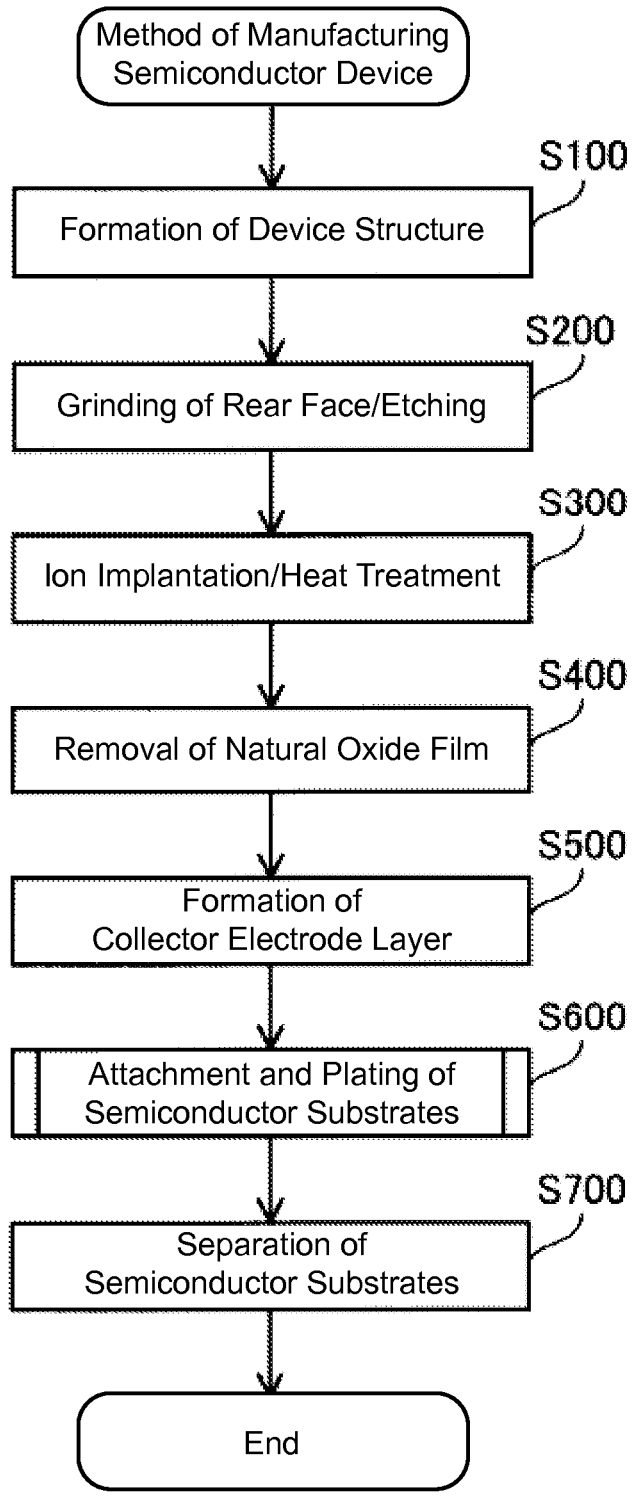
FIG. 4 is a flow chart that shows a method of manufacturing a semiconductor device of Embodiment 2.

FIG. 4 is a flow chart that describes the manufacturing process of the semiconductor device of Embodiment 2.

FIGS. 5A to 5E illustrate the manufacturing process of the semiconductor device of Embodiment 2.

FIGS. 5A to 5E are side views of the semiconductor device. It should be noted that a specific configuration of the device structure 1020 is omitted from FIGS. 5A to 5E.

When the semiconductor substrate 1010 is placed in a prescribed location of the manufacturing device of the semiconductor device and the manufacturing device is then operated, the manufacturing device carries out the following steps.

Figure 5A:
FIGS. 5A to 5E illustrate the method of manufacturing the semiconductor device of Embodiment 2.

<Step S100> As shown in FIG. 5A, a device structure 1020 is formed on a 6-inch semiconductor substrate 1010, for example. Specifically, n-type and p-type ions are respectively implanted in prescribed regions on the front surface of the semiconductor substrate 1010, thereby forming a $p^+$ base region 1021 and $n^+$ emitter regions 1022a, 1022b. Furthermore, film deposition or the like is performed on the semiconductor substrate 1010 using prescribed materials, thereby forming the gate oxide layer 1023a, 1023b, the gate electrode layer 1024a, 1024b, the interlayer insulation layer 1025a, 1025b, and the emitter electrode layer 1026. In this manner, the device structure 1020 is formed on the semiconductor substrate 1010.

<Step S200> The rear surface side of the semiconductor substrate 1010 is ground (back grinding), thereby thinning the semiconductor substrate 1010. It is preferable that, in order to maintain a fixed strength and an ability to withstand a prescribed voltage, the thickness of the thinned semiconductor substrate 1010 be approximately 30 μm to 200 μm.

Figure 5B:

Next, in order to remove damage, such as distortions caused by grinding, to the surface of the rear surface side of the semiconductor substrate 1010, the rear surface side of the semiconductor substrate 1010 is removed via etching. For example, 20 μm are removed via etching, and, as shown in FIG. 5B, a semiconductor substrate 1010 with a thickness of 30 μm to 200 μm is obtained. Wet etching or dry etching can be used in the etching process. Wet etching is used in this example.

By using a spin etcher to etch the rear surface, damage to the front surface of the semiconductor substrate 1010 due to etching can be suppressed. A spin etcher is one type of spinning etcher that performs etching by dripping a chemical solution from above onto a spinning wafer. Compared to a dip etcher in which the wafer is submerged in the chemical solution, it is easier to uniformly carry out etching across the entire surface of the wafer and the etchant has less effect on the front surface. Thus, damage to the front surface side due to etching can be suppressed. Nitric acid or a mixed acid whose primary constituent is nitric acid can be used for etching.

<Step S300> N-type ions (phosphorus, for example) and a high concentration of p-type ions (boron, for example) are successively implanted in the rear surface side of the semiconductor substrate 1010. After the ions are implanted, heat treatment is performed to activate the ions. By so doing, the n-buffer layer 1030 and the p⁺ collector layer 1040 are formed on the rear surface side of the semiconductor substrate 1010.

<Step S400> A natural oxide film formed on the front surface of the p⁺ collector layer 1040 is removed using dilute hydrofluoric acid.

Figure 5C:

<Step S500> Metal layers of aluminum, titanium, nickel, and gold are successively stacked on the front surface of the p⁺ collector layer 1040 via evaporation or sputtering, thereby forming the collector electrode layer 1050, as shown in FIG. 5C.

Figure 5D:
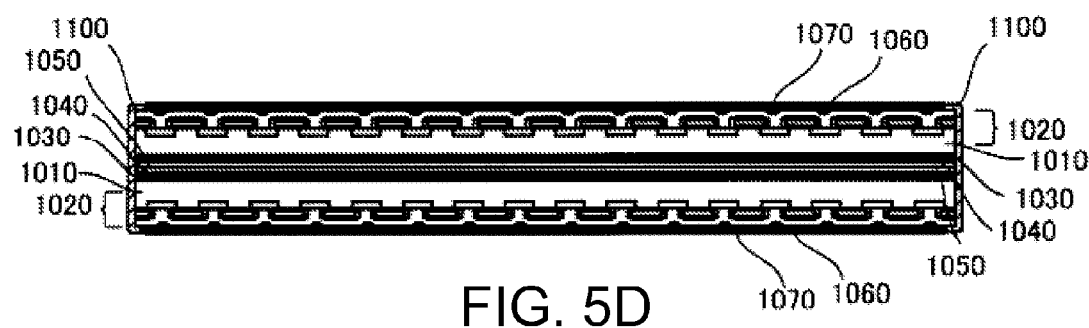

<Step S600> As shown in FIG. 5D, the rear surfaces of the semiconductor substrates 1010 formed in this way are attached to each other, and a film 1100 is provided on the outer edges of the attached semiconductor substrates 1010.

Furthermore, the front surfaces of the semiconductor substrates 1010 are plated, forming plating layers (a nickel plating layer 1060 and a gold plating layer 1070).

Step S600 will be explained later in more detail.

Figure 5E:
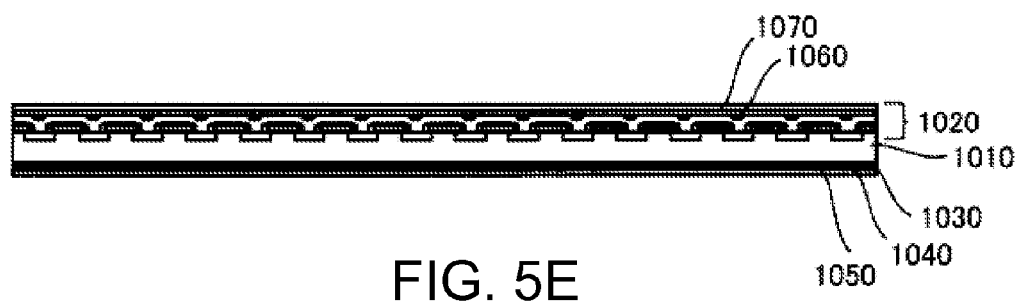

<Step S700> The film 1100 is detached and the attached semiconductor substrates 1010 are separated, resulting in a semiconductor substrate 1010 such as the substrate shown in FIG. 5E.

Afterwards, the separated semiconductor substrates 1010 are individually divided by dicing, resulting in the formation of the semiconductor devices 1000.

Next, Step S600 in the flow chart in FIG. 4 will be explained in more detail using FIGS. 6 and 7A to 7D.

Figure 6:
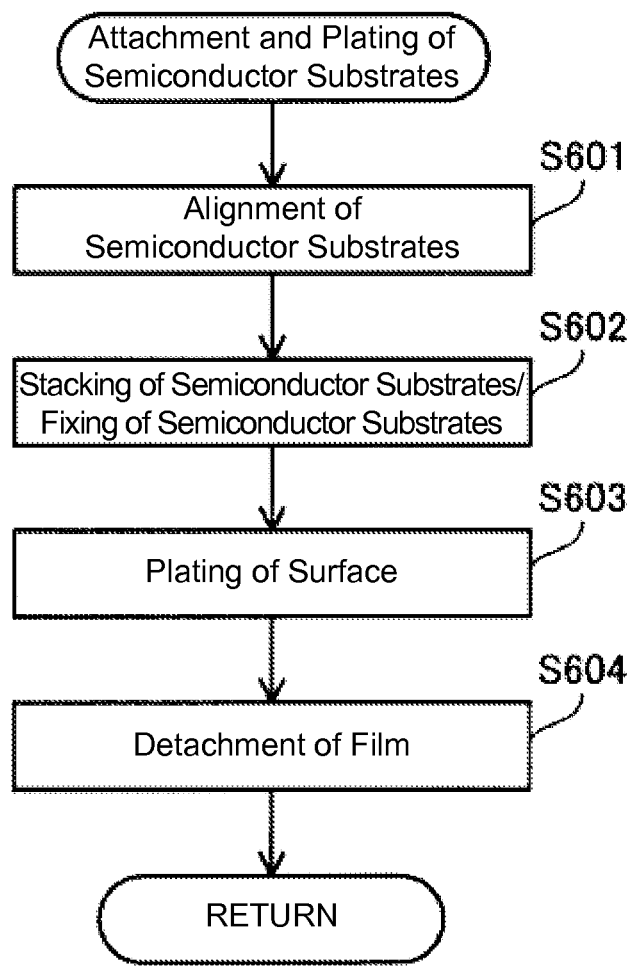
FIG. 6 is a flow chart that shows a step of bonding and plating a semiconductor substrate that is carried out as a part of the method of manufacturing the semiconductor device of Embodiment 2.

FIG. 6 is a flow chart that describes the step of attaching and plating the semiconductor substrates, which is carried out during the method of manufacturing the semiconductor device of Embodiment 2.

FIGS. 7A to 7D illustrate the step of attaching and plating the semiconductor substrates, which is carried out during the method of manufacturing the semiconductor device of Embodiment 2.

Figure 7A:
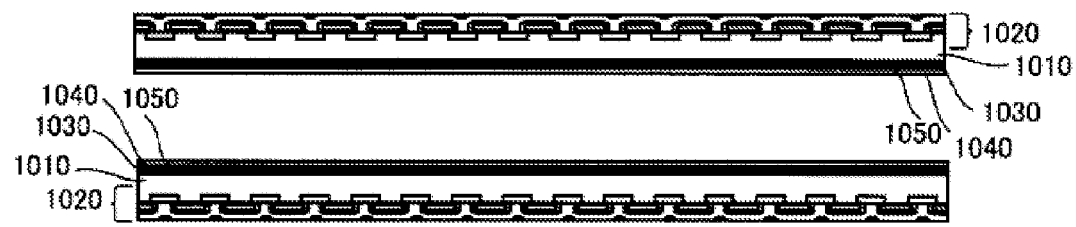
FIGS. 7A to 7D illustrate the step of bonding and plating the semiconductor substrate that is carried out as a part of the method of manufacturing the semiconductor device of Embodiment 2.
Figure 7B:
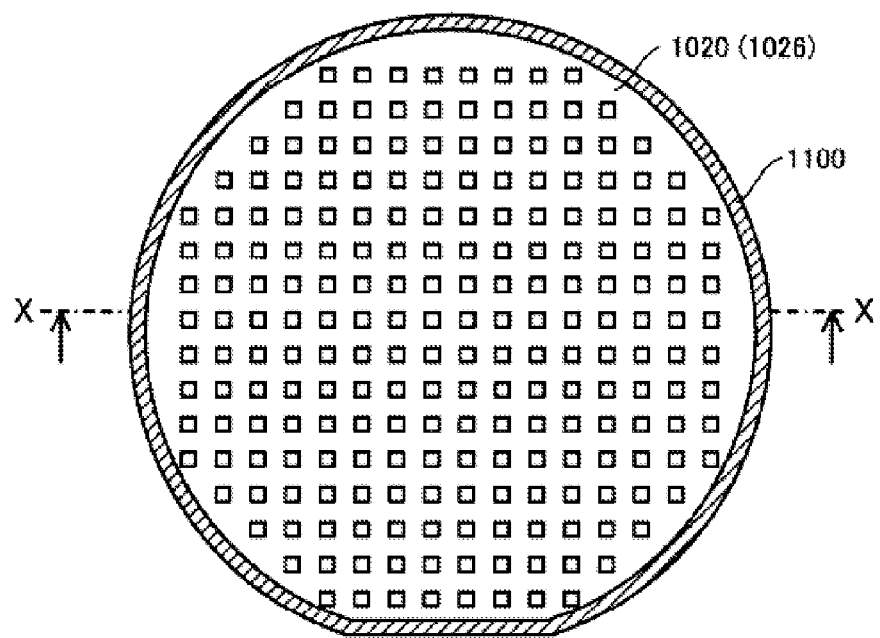
Figure 7C:
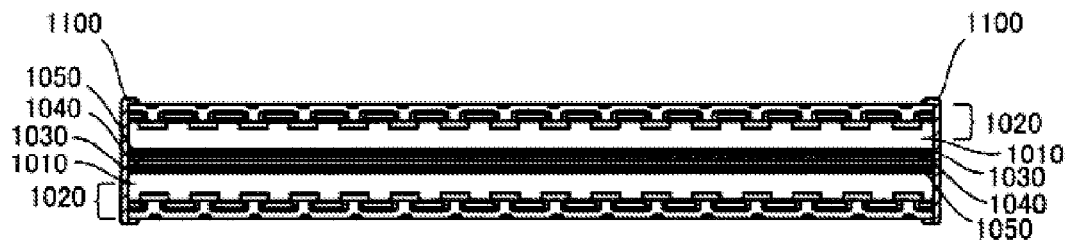
Figure 7D:
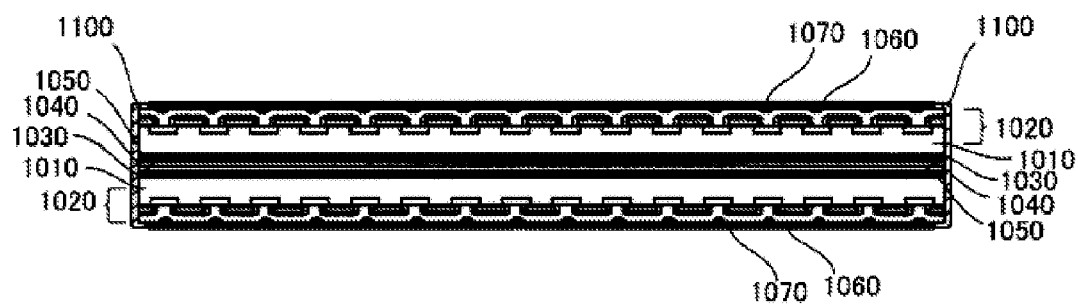

FIGS. 7A and 7D are side views of the semiconductor substrates. FIG. 7B is a top view of the stacked semiconductor substrates. FIG. 7C is a cross-section along the dashed-dotted line X-X in FIG. 7B.

<Step S601> As shown in FIG. 7A, a pair of the semiconductor substrates 1010 are aligned.

<Step S602> As shown in FIGS. 7B and 7C, the pair of semiconductor substrates 1010 are stacked so that the orientation flats of the substrates match. Furthermore, the outer edges of the pair of semiconductor substrates 1010 are fixed to each other by attaching the film 1100, to which an adhesive layer has been attached, along the outer edges of the pair of the semiconductor substrates 1010. At this time, in order to protect the front surfaces of the semiconductor substrates 1010, a protective layer may be provided on the front surface sides of the pair of semiconductor substrates 1010. This protective layer is then detached before plating (Step S603), which will be explained later.

As shown in FIGS. 7B and 7C, the outer edges at this time include the side faces, the chamfered portions, and the outer edges of the front surfaces of the semiconductor substrates 1010.

In addition, while the pair of semiconductor substrates 1010 are fixed to a chuck stage or the like and then rotated, the film 1100 is wrapped around and attached to the outer edges of the semiconductor substrates 1010. When attaching the film 1100, the film 1100 is attached during one rotation of the semiconductor substrates 1010, and an extra approximately 1 to 10 cm of film 1100 is attached to the semiconductor substrates 1010. When detaching the film 1100, it is possible to easily detach the film 1100 by pulling on the excess portion of the film 1100.

When the semiconductor substrates 1010 are thinned in Step S200 shown in FIG. 4, in accordance with the element pattern formed on the semiconductor substrates 1010, various types of warping, in which shape and orientation are altered, occur on the front surfaces of the semiconductor substrates 1010. By attaching the film 1100 along the entire outer edges of the semiconductor substrates 1010, warping of the semiconductor substrates 1010 can be corrected, and the flatness of the semiconductor substrates 1010 can be improved. Compared to before the film 1100 is attached, the flatness of the semiconductor substrates 1010 may be improved by approximately 50% by attaching the film 1100, for example.

In order to planarize the semiconductor substrates 1010, in addition to attaching the film 1100 to the outer edges of the pair of semiconductor substrates 1010, a bonding agent or the like may be provided in respective central regions of the pair of semiconductor substrates 1010. In this way, the semiconductor substrates 1010 can be further planarized.

The thickness of the film 1100 is between 10 μm and 100 μm. An acrylic adhesive, for example, may be used in the adhesive layer of the film 1100. In addition, the film 1100 is attached to the outer edges of the semiconductor substrates 1010 so as not to cover the surfaces (device surfaces) of the semiconductor substrates 1010 on which the device structures 1020 are formed. The film 1100 may be a polyimide film, a polyolefin film, a vinyl chloride film, a polypropylene film, an ABS film, a polyethylene terephthalate (PET) film, a nylon film, or a polyurethane film, for example. These films are heat- and chemically-resistant. It is especially preferable that a polyolefin film, which has superior heat-resistance and elasticity, or a polyimide film, which has excellent heat- and chemical-resistance, be used. Additionally, it is necessary for the film 1100 to be able to tolerate high temperatures (100° C., for example) that occur during plating.

Nylon films are less heat- and chemically-resistant and cheaper than other films. Thus, nylon films are limited to use in cases in which the submersion time in the plating solution is short and the chemical solution thus does not reach a cured resin inside the film even if the solution permeates into the film. In addition, when the plating layers, which will be explained later, formed during plating are thin and the submersion time in the plating solution is short, a polyethylene terephthalate (PET) film may be used as the film 1100. Another option is to increase the thickness of the polyethylene terephthalate (PET) film within the range in which the film can be attached to the outer edges of the semiconductor substrates 1010, thus making it possible to increase the amount of time it will take for the chemical solution to permeate the film and reach the cured resin.

<Step S603> The front surface of the device structure 1020 (the emitter electrode layer 1026) on the front surface side of the pair of semiconductor substrates 1010 is plated via electroless plating.

The front surfaces of the semiconductor substrates 1010 are planarized in Step S602. Thus, as shown by FIG. 7D, when plating the semiconductor substrates 1010 using electroless plating, it is possible to successively deposit a nickel plating layer 1060 and a gold plating layer 1070 on the emitter electrode layer 1026 on the front surface side of the respective semiconductor substrates 1. The thickness of the nickel plating layer 1060 is approximately 5 μm, for example, and the thickness of the gold plating layer 1070 is approximately 0.03 μm, for example. Pre-treatment may also be carried out during plating. The pre-treatment may further include zincate treatment.

The plating can be performed at the same time on a plurality of pairs of the semiconductor substrates 1010. A portion of the nickel plating layer 1060 may be melted by solder when the solder is applied during mounting. The nickel plating layer 1060 is thicker than the nickel layer, which is one of the metal layers that forms the emitter electrode layer 1026. After the solder has been applied during mounting, the nickel plating layer 1060 may be formed at a thickness such that approximately 2 µm will be left over, for example. Such a thickness of the nickel plating layer 1060 can be obtained by controlling the amount of time used in plating in accordance with the precipitation speed of the nickel plating layer 1060, for example. Even if the nickel plating layer 1060, which has been formed by setting the duration of plating in such a manner, is melted by solder when solder is applied, the entire nickel plating layer 1060 will not melt and the solder will not reach the aluminum layer, which has poor adhesion and is one of the layers that forms the emitter electrode layer 1026.

<Step S604> The film 1100 that fixes the outer edges of the pair of semiconductor substrates 1010 is detached. At such time, the film 1100 is detached so as not to damage the device structure surfaces of the semiconductor substrates 1010.

Once the above-mentioned steps have been completed, Step S700 in FIG. 4 is carried out.

In this manner, the pair of semiconductor substrates 1010, which have the device structure 1020 on the respective front surfaces thereof, are prepared. The semiconductor substrates 1010 are stacked such that the rear surfaces thereof face each other, and the outer edges of the stacked semiconductor substrates 1010 are fixed along the outer edges by the film 1100. As a result, warping of the front surfaces of the semiconductor substrates 1010 is prevented, and the flatness of the semiconductor substrates 1010 is increased. Therefore, when this kind of semiconductor substrate 1010 is plated, the plating of the front surface can be done without disruptions in the flow of plating solution to the front surface. The concentration of precipitation ions within the plating solution becomes uniform, and the thickness distribution of the plating layers (the nickel plating layer 1060 and the gold plating layer 1070) formed on the front surface improves. In addition, the pair of semiconductor substrates 1010 are stacked so that the rear surfaces thereof face each other. Thus, the plating layers (the nickel plating layer 1060 and the gold plating layer 1070) can be simultaneously formed on the front surfaces of the two semiconductor substrates 1010, and plating solution can be prevented from spreading to the rear surfaces of the semiconductor substrates 1010. In addition, the film 1100 is attached to the outer edges of the pair of semiconductor substrates 1010 along the outer edges. Thus, plating solution is prevented from entering the gap between the pair of stacked semiconductor substrates 1010. Therefore, the plating layers (the nickel plating layer 1060 and the gold plating layer 1070) can be appropriately and inexpensively formed on the semiconductor substrates 1010, and the productivity of the semiconductor devices 1000 is increased.

In Step S603 of FIG. 6, a method of plating that used electroless plating was described. However, the method of plating is not limited to electroless plating, and electroplating can also be used, for example.

In electroplating, plating is formed on a portion of an electrode, which is used to pass current to the plating solution, that contacts the plating solution. After the collector electrode layer 1050 is formed, a UBM (under barrier metal) layer (not shown) is formed by sputtering or the like on the front surface side of the semiconductor substrate 1010 to function as an electrode for electroplating the front surface side of the semiconductor substrate 1010. Titanium, nickel, chromium, copper, or the like may be used as the UBM layer.

Next, a resist is applied on the UBM layer and, during patterning, resist is left on the portions of the front surface side on which the formation of plating layers is not desired. A curable resin is applied to the collector electrode layer 1050, a rear surface protective film is attached, and the curable resin is then cured.

Next, electroplating is performed using the UBM layer as an electrode, and plating layers (the nickel plating layer 1060 and the gold plating layer 1070) with a desired thickness are formed.

Next, the resist is detached from the front surface, and the portions of the UBM layer not covered by the plating layers are removed by etching.

Since the UBM layer is formed by evaporation or sputtering, the UBM layer can also form on the side surfaces of the semiconductor substrate 1010 and electrically connect to the collector electrode layer 1050. In this state, if electroplating is performed without protecting the collector electrode layer 1050, unintended plating layers will be formed on the collector electrode layer 1050.

However, since the film 1100, which has an adhesive layer, is disposed so as to cover the collector electrode layer 1050 side of the substrate before electroplating is performed, the plating solution will not come into contact with the collector electrode layer 1050. In addition, since the film 1100 with the adhesive layer also covers the outer edges of the semiconductor substrates 1010, unintended plating layers can be prevented from depositing on the collector electrode layer 1050.

Thus, the step of attaching the film 1100 may be carried out before electroplating is performed. The step of attaching the film 1100 may be carried out before the formation of the UBM layer or before the application of the resist to the front surface, for example.

Additionally, in Embodiment 2, an example was used in which the nickel plating layer 1060 and the gold plating layer 1070 were stacked as plating layers on the emitter electrode layer 1026. The plating layers are not limited to just these two layers, however. For example, the following may also be used as the plating layers: electroless nickel-phosphorus alloy plating, immersion gold plating, electroless gold plating, electroless nickel-palladium-phosphorus alloy plating, electroless nickel-boron alloy plating, electroless nickel-phosphorus-PTFE (a fluororesin) composite plating, electroless nickel-boron-graphite composite plating, electroless copper plating, electroless silver plating, electroless palladium plating, electroless platinum plating, electroless rhodium plating, electroless ruthenium plating, electroless cobalt plating, electroless cobalt-nickel alloy plating, electroless cobalt-nickel-phosphorus alloy plating, electroless cobalt-tungsten-phosphorus alloy plating, electroless cobalt-tin-phosphorus alloy plating, electroless cobalt-zinc-phosphorus alloy plating, electroless cobalt-manganese-phosphorus alloy plating, electroless tin plating, and electroless solder plating.

Also in Embodiment 2, an example was used in which plating layers (the nickel plating layer 1060 and the gold plating layer 1070) were formed on the emitter electrode layer 1026. The plating layers are not limiting to being formed on the emitter electrode layer 1026, however. Plating layers can be formed on the gate electrode layer 1024*a*, 1024*b*, at the same time and in a similar manner, as the plating layers on the emitter electrode layer 1026.

Furthermore, in Embodiment 2, an example was used in which aluminum-silicon was used as a metallic underlayer for the plating layers (the nickel plating layer 1060 and the gold plating layer 1070). The underlayer is not limited to such a layer, however, and a nickel layer may be formed by evaporation or sputtering on the aluminum-silicon-layer, with the plating layers (the nickel plating layer 1060 and the gold plating layer 1070) being formed on the front surface thereof, for example.

<Embodiment 3>

In Embodiment 3, an example will be explained in which the step of attaching and plating semiconductor substrates 1010 is different from the corresponding step in Embodiment 2.

A semiconductor device 1000 of Embodiment 3 is also manufactured using the flow chart shown in FIG. 4.

However, in Embodiment 3, processes different from that of Embodiment 2 are carried out in Step S600 of the flow chart in FIG. 4. These processes are shown in FIGS. 8 and 9A to 9D.

Figure 8:
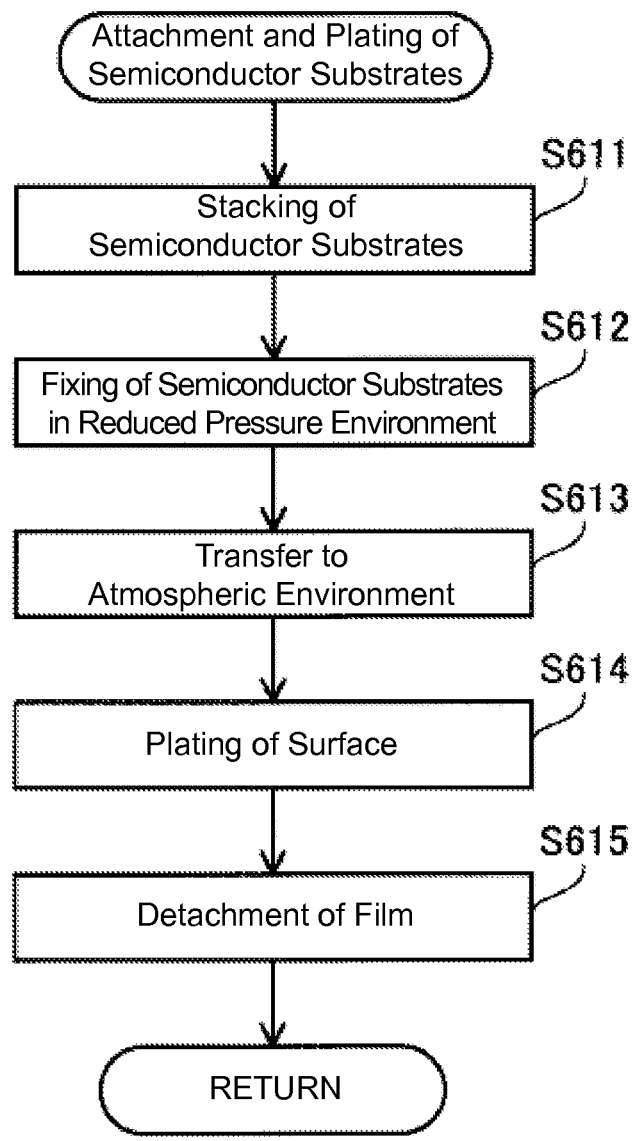
FIG. 8 is a flow chart that illustrates a step of bonding and plating a semiconductor substrate that is carried out as a part of a method of manufacturing a semiconductor device of Embodiment 3.

FIG. 8 is a flow chart that shows the step of attaching and plating the semiconductor substrates that is carried out during the manufacturing process of a semiconductor device according to Embodiment 3.

FIGS. 9A to 9D illustrate the step of attaching and plating the semiconductor substrates that is carried out during the manufacturing process of the semiconductor device according to Embodiment 3.

FIGS. 9A to 9D are side views of the semiconductor substrates.

Once a collector electrode layer 1050 is formed on the semiconductor substrate 1010 in Step S500 of FIG. 4, the following steps are performed.

Figure 9A:
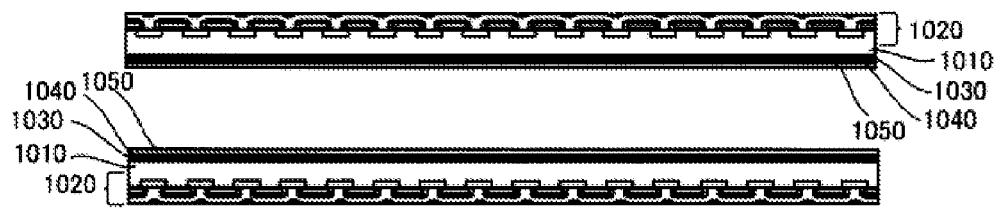
FIGS. 9A to 9D illustrate the step of bonding and plating the semiconductor substrate that is carried out as a part of the method of manufacturing the semiconductor device of Embodiment 3.

<Step S611> As shown in FIG. 9A, a pair of the semiconductor substrates 1010 are placed within a chamber, and the pair of semiconductor substrates 1010 are aligned inside the chamber.

The pair of semiconductor substrates 1010 may also be placed within the chamber after first being aligned.

<Step 612> The air within the chamber is evacuated, and the air pressure inside the chamber is reduced to 0.9 atm or less (0.8 atm, for example).

Figure 9B:
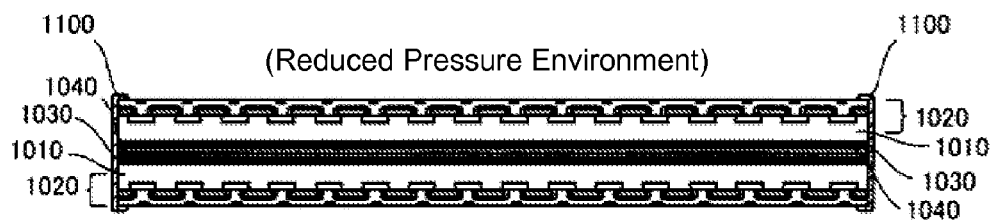

Once the air pressure has been reduced, as shown in FIG. 9B, the pair of semiconductor substrates 1010 are stacked, and the outer edges thereof are attached by attaching a film 1100 along the outer edges. In this way, the outer edges of the pair semiconductor substrates 1010 are secured. This film 1100 is formed of a polycarbonate base material with a thickness of 20 μm, for example. At this time, the pair of semiconductor substrates 1010 are planarized. Furthermore, the space (interior space) between the rear surfaces of the pair of semiconductor substrates 1010 to which the film 1100 is attached is sealed.

The film 1100 is formed of the material described in Embodiment 2. Additionally, the adhesive attached to the film 1100 may be a thermosetting resin. In such a case, after the film 1100 is attached, the adhesion of the film 1100 is increased by heat treating the locations at which the film 1100 is attached, which in turn further increases the extent to which the internal space is sealed.

Figure 9C:
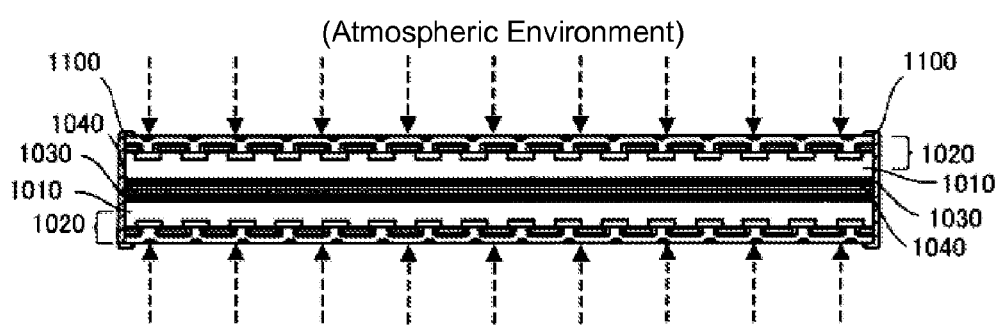

<Step S613> The pair of semiconductor substrates 1010, of which the outer edges were fixed by the film 1100 in such a manner in a reduced pressure environment, are moved from the interior to the exterior (atmospheric environment) of the chamber, as shown in FIG. 9C.

When this happens, since the air pressure in the interior space between the pair of semiconductor substrates 1010 is below atmospheric pressure, the pair of semiconductor substrates 1010 are subject to atmospheric pressure, further flattening any warping of the front surfaces of the semiconductor substrates 1010.

Figure 9D:
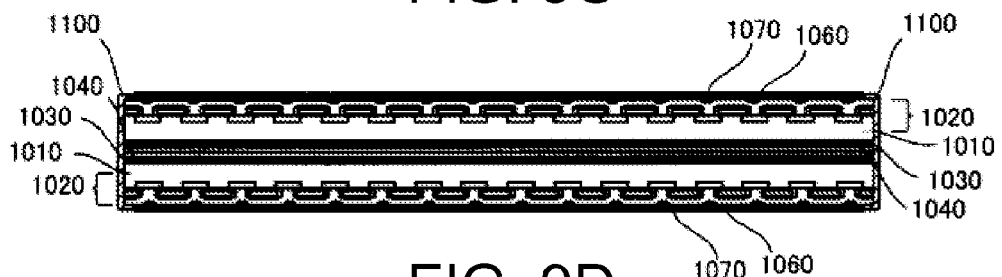

<Step S614> As shown in FIG. 9D, the respective front surfaces of the emitter electrode layers 1026 in the device structures 1020 on the front surface sides of the pair of the semiconductor substrates 1010 are plated using electroless plating. In regards to the layers making up the plating layers formed in this manner, a nickel plating layer 1060 may have a thickness of 5 μm and a gold plating layer 1070 may have a thickness of 0.03 μm, for example.

The method of plating used in such a case is not limited to electroless plating, and, similar to Embodiment 2, electroplating can be used instead.

<Step S615> The film 1100 is detached from the pair of semiconductor substrates 1010. When this occurs, the film is detached so as not to damage the device structure surface of the semiconductor substrates 1010.

Once the above-mentioned steps have been completed, Step S700 in FIG. 4 is carried out.

In Step S614 (plating) of the flow chart in FIG. 8, 50 stacked pairs of semiconductor substrates 1010 were placed in a plating case and batched. The thickness distribution of the plating layer formed on the front surface of such a semiconductor substrate 1010 was on average 5% for the 50 pairs of substrates. The thickness distribution was 6% in Embodiment 2.

Plating is conducted in a similar manner even when a glass support member, which has a thickness of 500 μm and functions as a support plate, is attached to the rear surface side of one of the semiconductor substrates 1010.

An example of a semiconductor substrate 1010 in which the glass support member is attached as a support plate to the rear surface of the semiconductor substrate 1010 will be explained next.

First, an adhesive solution is applied to the rear surface of the semiconductor substrate 1010 using a spinner, for example. An acrylic resin or a novolac phenolic resin material can be used in the adhesive solution, for example.

Next, an adhesive layer is formed by heat treating and drying the adhesive solution applied to the rear surface of the semiconductor substrate 1010. The support plate is attached to the rear surface side of the semiconductor substrate 1010 on which the adhesive layer was formed. The diameter of the support plate is slightly larger than the diameter of the semiconductor substrate 1010. A porous glass carrier (glass support member) that has a thickness of 500 μm and that has pores with a diameter of 0.3 mm formed at a pitch of 0.5 mm, for example, can be used as the support plate. It is preferable that the thickness of the glass support member be greater than or equal to 500 μm in order to correct warping of the semiconductor substrate.

A pressing device is used to press on the semiconductor substrate 1010 to which the support plate has been attached while the semiconductor substrate 1010 is heated in a vacuum, thereby mounting the support plate on the semiconductor substrate 1010.

By immersing in a plating bath the semiconductor substrate 1010 to which the support plate has been mounted in such a manner, the front surface of the semiconductor substrate 1010 can be plated. By immersing the semiconductor substrate 1010 in plurality, a plurality of semiconductor substrates 1010 can be plated at the same time.

However, the thickness distribution of plating layers formed in this way on the semiconductor substrate 1010 was on average 10% for the 50 pairs of semiconductor substrates. Since the support plate, which is a glass support member, is thicker than the semiconductor substrate 1010, the gap between the semiconductor substrates 1010 is narrower, and it is possible that the flow of the plating solution becomes uneven. Thus, it is possible that deviations occurred in the thickness of the plating layers on the rear surface of the semiconductor substrates 1010, and that the thickness distribution of the plating layer therefore became worse. In addition, there will be a difference in the amount of plating deposited on the surface of the semiconductor substrate 1010 on which the plating layer is formed and the glass support member on the opposite side. Thus, it is possible that deviations occurred in the concentration of precipitation ions in the plating solution, which resulted in a poorer thickness distribution of the plating layer.

The thickness of the plating was measured using an X-ray fluorescence film thickness gauge. The thickness was measured at 48 locations on the surface of the plating, the thickness distribution of the plating surface was set as the coefficient of variation, and the average thickness distribution of the 50 pairs of semiconductor substrates was calculated.

In this way, the pair of semiconductor substrates 1010 that respectively have the device structure 1020 on the front surface thereof are prepared. In a reduced pressure environment, the semiconductor substrates 1010 are stacked so that the rear surfaces thereof face each other, and the outer edges of the stacked semiconductor substrates 1010 are fixed along the outer edges by the film 1100. As a result, warping of the front surface of the semiconductor substrates 1010 is prevented, and the flatness of the semiconductor substrates 1010 is increased. Furthermore, the pair of semiconductor substrates 1010, to which the film 1100 is attached on the outer edges thereof, were transferred to atmospheric pressure. By so doing, the semiconductor substrates 1010 are subjected to atmospheric pressure, and the amount of air in the interior space between the rear surfaces of the semiconductor substrates 1010 can be reduced. In addition, by having the substrates subjected to atmospheric pressure, the flatness of the semiconductor substrates 1010 is increased.

Therefore, since expansion of the air in the interior space of the semiconductor substrates 1010 due to temperature increases that occur during plating can be reduced when such a semiconductor substrate 1010 is plated, the film 1100, which is attached to the semiconductor substrates 1010, is prevented from detaching. This is a result of less air in the interior space due to decreased pressure. Thus, plating solution is prevented from entering the space between the semiconductor substrates 1010 during plating. Since plating solution will not enter the space between the semiconductor substrates 1010, plating layers will not be precipitated on the rear surfaces of the semiconductor substrates 1010 and the formation of unnecessary deposits near the outer edges of the semiconductor substrates 1010 can be suppressed. In addition, by improving the flatness of the semiconductor substrates 1010, plating can be performed without disruptions in the flow of plating solution to the front surfaces of the semiconductor substrates 1010. Furthermore, the thickness distribution of the plating layers (the nickel plating layer 1060 and the gold plating layer 1070) formed on the front surface of the semiconductor substrate 1010 also improves. In addition, the pair of semiconductor substrates 1010 are stacked so that the rear surfaces thereof face each other. Thus, the plating layers (the nickel plating layer 1060 and the gold plating layer 1070) can be simultaneously formed on the front surfaces of the two semiconductor substrates 1010, and plating solution can be prevented from spreading to the rear surfaces of the semiconductor substrates 1010. In addition, the film 1100 is attached to the outer edges of the pair of semiconductor substrates 1010 along the outer edges. Thus, plating solution is prevented from entering the space between the pair of stacked semiconductor substrates 1010. Therefore, the plating layers (the nickel plating layer 1060 and the gold plating layer 1070) can be appropriately and inexpensively formed on the semiconductor substrates 1010, and the productivity of the semiconductor devices 1000 can be increased. The temperature of the plating solution during plating was set to 80° C.

In addition, such a case is superior to a case in which the support plate is mounted since the steps of attaching and detaching the support plate are unnecessary. In particular, since it is difficult to reliably detach the adhesive layer, such a case increases product quality.

<Embodiment 4>

In Embodiment 4, an example in which a semiconductor substrate that is different from the semiconductor substrates 1010 of Embodiments 2 and 3 will be described using FIGS. 10A to 10C.

Figure 10A:
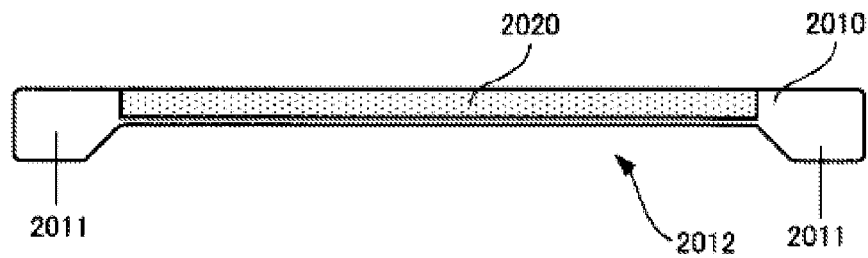
FIGS. 10A to 10C illustrate a step of bonding and plating a semiconductor substrate that is carried out as a part of a method of manufacturing a semiconductor device of Embodiment 4.
Figure 10B:
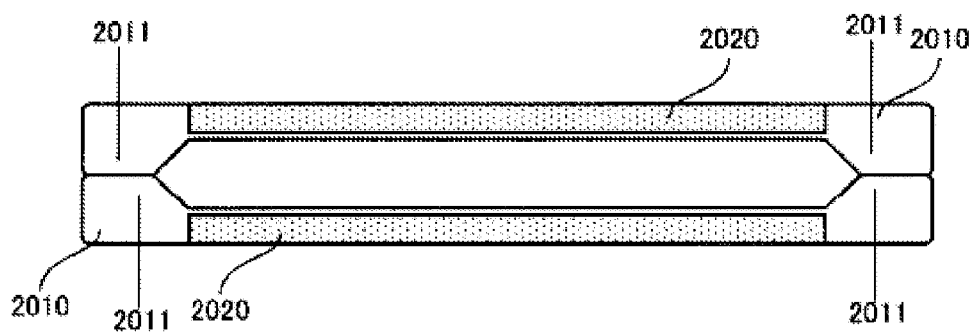
Figure 10C:
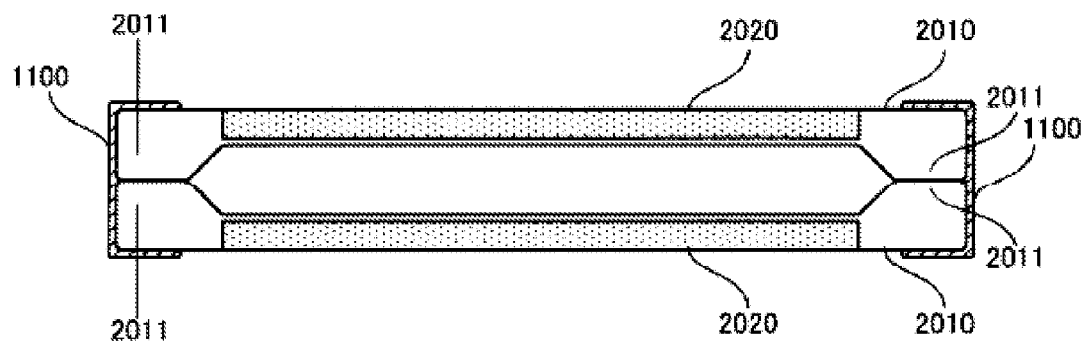

FIGS. 10A to 10C illustrate the step of attaching and plating a semiconductor substrate that is carried out during the manufacturing process of a semiconductor device according to Embodiment 4.

FIGS. 10A to 10C are side views of a semiconductor substrate 2010.

As shown in FIG. 10A, outer edge portions 2011 of the semiconductor substrate 2010 of Embodiment 4 are not removed, and the substrate is thinned by grinding only a central region 2012 of the rear surface. Since outer edge portions 2011 of such a semiconductor substrate 2010 are not ground and the thickness of the outer edge portions 2011 is the same as the original thickness, mechanical strength can be maintained and cracking and warping can be reduced.

In addition, as in Embodiments 2 and 3, a device structure 2020 can be formed on the front surface of such a semiconductor substrate 2010. A detailed explanation of the device structure 2020 will not be given here, but the device structure 2020 has the same structure as the device structure 1020 in FIGS. 3A and 3B. Such a semiconductor substrate 2010 includes an n buffer layer, a $p^+$ collector layer, and a collector electrode layer identical to those of Embodiments 2 and 3 in the central region 2012 of the rear surface of the semiconductor substrate 2010. These respective layers are omitted from FIGS. 10A to 10C, however.

Additionally, by the processes shown in the flow chart in FIG. 4, a semiconductor device 1000 can be formed from the semiconductor substrate 2010.

The processes shown in the flow charts in FIGS. 6 and 8 can be used in Step S600 of FIG. 4 for the semiconductor substrate 2010 as well.

First, similar to the processes shown in Step S601 (FIG. 6) and Step S611 (FIG. 8), a pair of the semiconductor substrates 2010 can be aligned and stacked (FIG. 10B). In a pair of semiconductor substrates 2010 formed in such a way, the outer edge portions 2011 and the central regions 2012 face each other, and a cavity is formed between the semiconductor substrates 2010.

Next, as shown in Step S602 (FIG. 6) and Step S612 (FIG. 8), a film 1100, which has an adhesive layer, can be attached along the outer edges of the stacked semiconductor substrates 2010 (FIG. 10C).

In particular, in Steps S611 and S612 of the flow chart in FIG. 8, the pressure in the cavity formed between the pair of semiconductor substrates 2010 will be lower than atmospheric pressure. Furthermore, in Step S613, the pair of semiconductor substrates 2010 will be subjected to atmospheric pressure.

In this way, the semiconductor substrate 2010 can be used in place of the semiconductor substrates 1010 of Embodiments 2 and 3. In addition, even if the semiconductor substrate 2010 is used in this way, effects identical to that of Embodiments 2 and 3 can be obtained. Specifically, when the semiconductor substrate 2010 was used in place of the semiconductor substrate 1010 of Embodiment 2, the thickness distribution of the plating layer for the 50 pairs of semiconductor substrates was 6% on average. Furthermore, when the semiconductor substrate 2010 was used in place of the semiconductor substrate 1010 of Embodiment 3, the thickness distribution of the plating layer for the 50 pairs of semiconductor substrates was 5% on average.

<Embodiment 5>

In Embodiment 5, an example will be explained in which a specialized pressing jig is used to stack the semiconductor substrates of Embodiment 2.

A semiconductor device 1000 of Embodiment 5 is also manufactured using the flow chart shown in FIG. 4.

However, in Embodiment 5, processes different from that of Step S600 of the flow chart in FIG. 4 are carried out. These processes are shown in FIGS. 11 and 12A to 12C.

Figure 11:
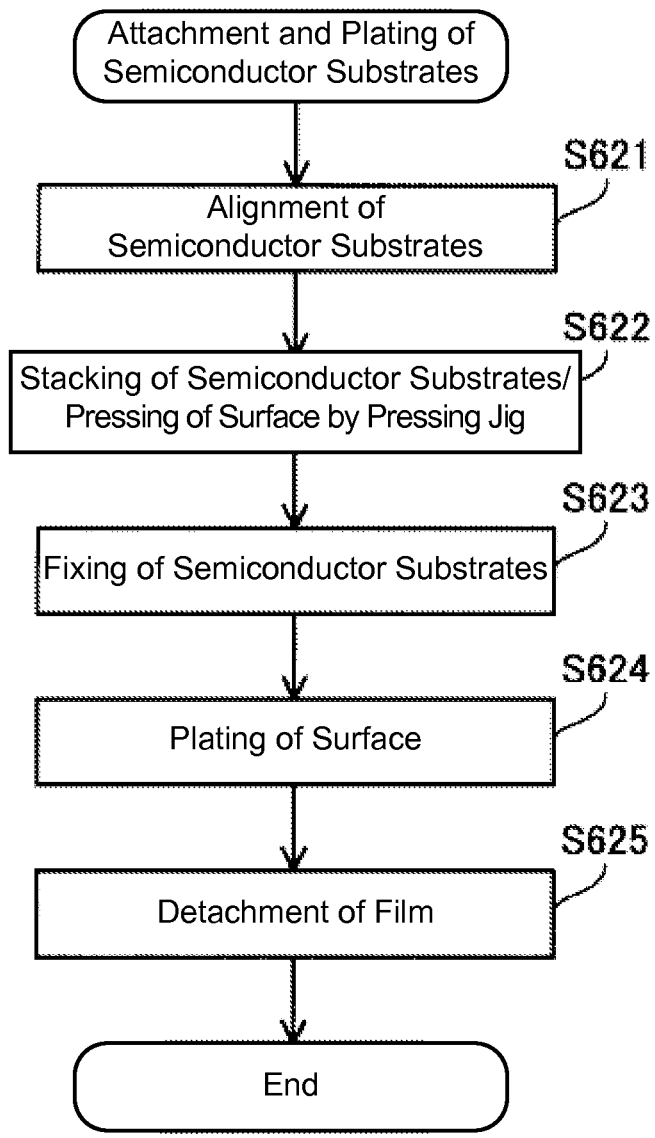
FIG. 11 is a flow chart that shows a step of bonding and plating a semiconductor substrate that is carried out as a part of a method of manufacturing a semiconductor device of Embodiment 5.

FIG. 11 is a flow chart that shows the step of attaching and plating the semiconductor substrates that is carried out during the manufacturing process of a semiconductor device according to Embodiment 5.

Figure 12A:
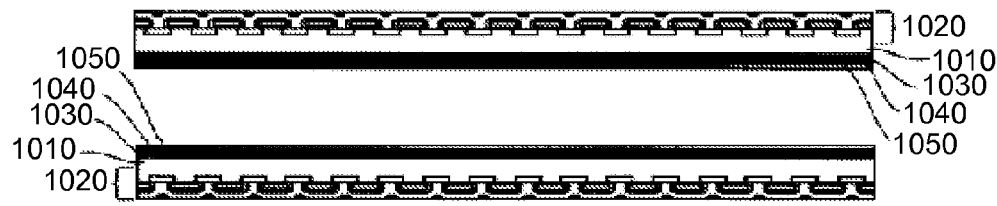
FIGS. 12A to 12C illustrate the step of bonding and plating the semiconductor substrate that is carried out as a part of the method of manufacturing the semiconductor device of Embodiment 5.
Figure 12B:
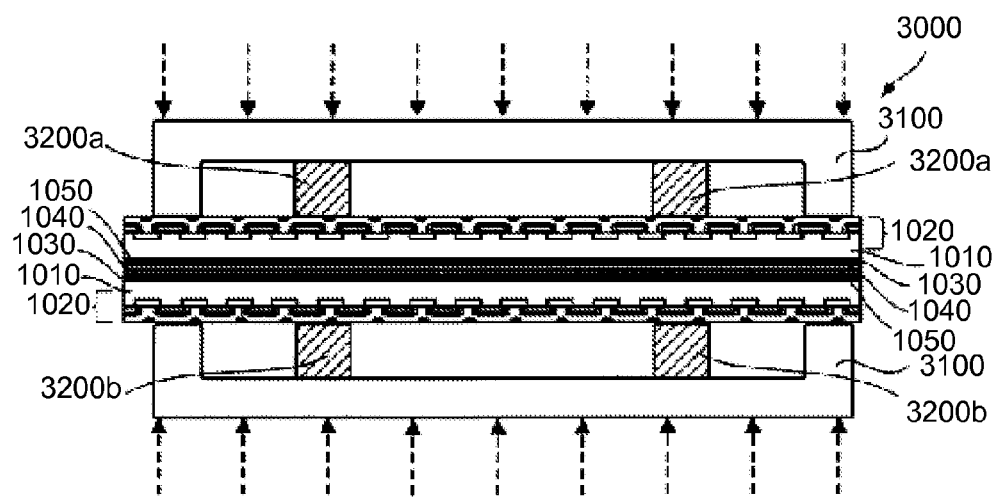
Figure 12C:
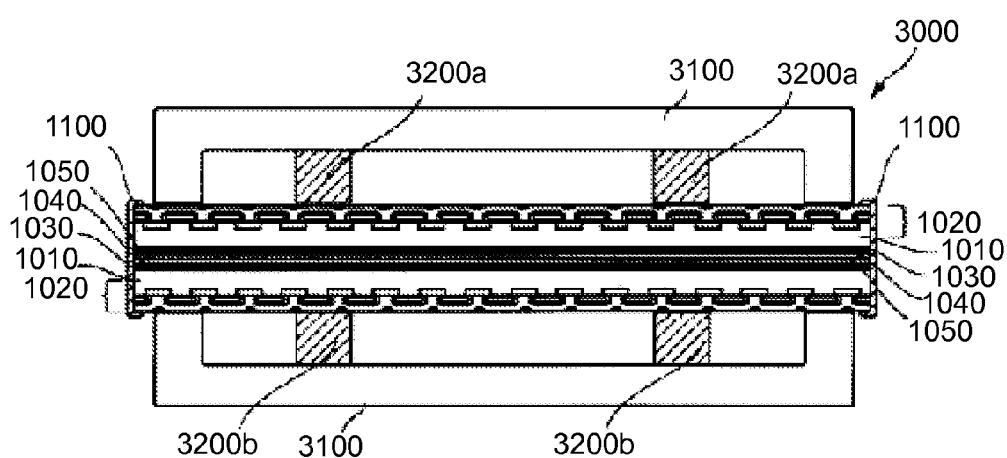

FIGS. 12A to 12C illustrate the step of attaching and plating the semiconductor substrates that is carried out during the manufacturing process of the semiconductor device according to Embodiment 5.

FIGS. 12A to 12C are side views of the semiconductor substrates when a pressing jig is used.

Once a collector electrode layer 1050 is formed on the semiconductor substrate 1010 in Step S500 of FIG. 4, the following steps are performed.

<Step S621> As shown in FIG. 12A, a pair of semiconductor substrates 1010 are aligned.

<Step S622> The aligned pair of semiconductor substrates 1010 are stacked, and, as shown in FIG. 12B, the stacked pair of semiconductor substrates 1010 are pressed by a pressing jig 3000.

The front surfaces of the pair of semiconductor substrates 1010 pressed in this manner by the pressing jig 3000 are planarized.

The pressing jig 3000 includes: a support section 3100, and pressing sections 3200a, 3200b disposed on the support section 3100. In particular, the contact surfaces of the pressing sections 3200a, 3200b, are formed of Teflon™ material, for example. Thus, in semiconductor substrates 1010 that are pressed by the pressing sections 3200a, 3200b, damage to the device surfaces can be suppressed. Only two pressing sections 3200a, 3200b are shown in FIGS. 12A to 12C; however, a plurality of pressing sections may be disposed on the support section 3100 in accordance with the size of the front surface of the semiconductor substrate 1010.

<Step S623> As shown in FIG. 12C, as the pair of semiconductor substrates 1010 are being pressed by the pressing jig 3000, the outer edges of the pair of semiconductor substrates 1010 are fixed by attaching a film 1100 with an adhesive layer along the outer edges of the semiconductor substrates 1010. A sealed interior space is formed by having the pressing jig 3000 press on the semiconductor substrates 1010 and evacuate air from the interior space between the rear surfaces of the semiconductor substrates 1010.

In order to protect the device structures on the front surfaces of the semiconductor substrates 1010 from the pressing jig 3000, a protective tape that includes a heat resistant base material and an adhesive can be attached to the device surface side of the semiconductor substrates 1010. After the film 1100 is attached along the outer edges, the protective tape may be detached. The protective tape on the portion of the semiconductor substrates 1010 that will be plated may also be detached before plating is performed.

<Step S624> The front surfaces of the emitter electrode layers 1026 of the device structures 1020 on the front surface sides of the pair of semiconductor substrates 1010 are plated via electroless plating.

As in the above-mentioned cases, the plating is not limited to electroless plating, and as in Embodiment 2, it is possible to use electroplating.

<Step S625> The film 1100 that fixes the outer edges of the pair of semiconductor substrates 1010 is detached. The film 1100 is detached at this time so that the device structure surfaces of the semiconductor substrates 1010 are not damaged.

Once the above-mentioned steps have been completed, the processes indicated in Step S700 of FIG. 4 are carried out.

In this way, the pair of semiconductor substrates 1010 that respectively include the device structure 1020 on the front surface side are prepared. The semiconductor substrates 1010 are stacked so that the rear surfaces thereof face each other, and the stacked semiconductor substrates 1010 are pressed by the pressing jig 3000. In this way, the semiconductor substrates 1010 are planarized, and air in the interior space between the rear surfaces of the semiconductor substrates 1010 is evacuated. The outer edges of the semiconductor substrates 1010 planarized in this way are fixed by a film 1100 along the outer edges. In this way, the front surfaces of the semiconductor substrates 1010 can be further flattened. Furthermore, the amount of air in the interior space between the rear surfaces of the semiconductor substrates 1010 can be reduced.

Therefore, when these semiconductor substrates 1010 are plated, since expansion of the air in the interior region of the semiconductor substrates 1010 caused by higher temperatures during plating is suppressed, the film 1100 attached to the semiconductor substrates 1010 is prevented from detaching. Thus, plating solution is prevented from entering the space between the semiconductor substrates 1010 during plating. Since the plating solution does not enter the space between the semiconductor substrates 1010, plating layers are not deposited on the rear surfaces of the semiconductor substrates 1010, and formation of unnecessary deposits of plating near the outer edges of the semiconductor substrates 1010 can be prevented. Furthermore, by increasing the flatness of the semiconductor substrates 1010, plating can be performed without disruptions in the flow of plating solution to the front surfaces of the semiconductor substrates 1010. Moreover, the thickness distribution of the plating layers (the nickel plating layer 1060 and the gold plating layer 1070) formed on the front surfaces of the semiconductor substrates 1010 will improve. The thickness distribution of the plating layers formed on the front surfaces of these semiconductor substrates 1010 was 5% on average for the 50 pairs of substrates. The pair of semiconductor substrates 1010 are also stacked so that the rear surfaces thereof face each other. Thus, the plating layers (the nickel plating layer 1060 and the gold plating layer 1070) can be formed simultaneously on the front surfaces of the pair of semiconductor substrates 1010, and the plating solution can be prevented from spreading to the rear surface sides of the semiconductor substrates 1010. In addition, the film 1100 is attached to the outer edges of the pair of semiconductor substrates 1010 along the outer edges. Thus, plating solution is prevented from entering the space between the stacked pair of semiconductor substrates 1010. Therefore, the plating layers (the nickel plating layer 1060 and the gold plating layer 1070) can be appropriately and inexpensively formed on the semiconductor substrates 1010, and productivity of the semiconductor devices 1000 is improved.

<Embodiment 6>

In Embodiment 6, an example which uses a semiconductor substrate 2010 (FIG. 10A) of Embodiment 4 in Embodiment 5 will be explained using FIGS. 13A and 13B.

Figure 13A:
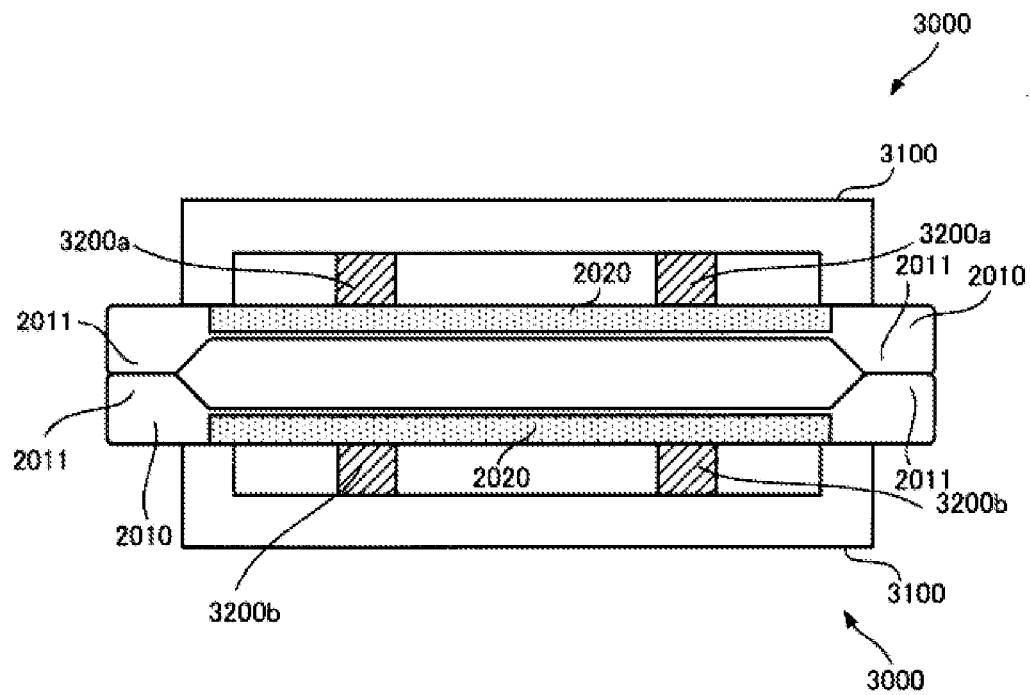
FIGS. 13A to 13B illustrate a step of bonding and plating a semiconductor substrate that is carried out as a part of a method of manufacturing a semiconductor device of Embodiment 6.
Figure 13B:
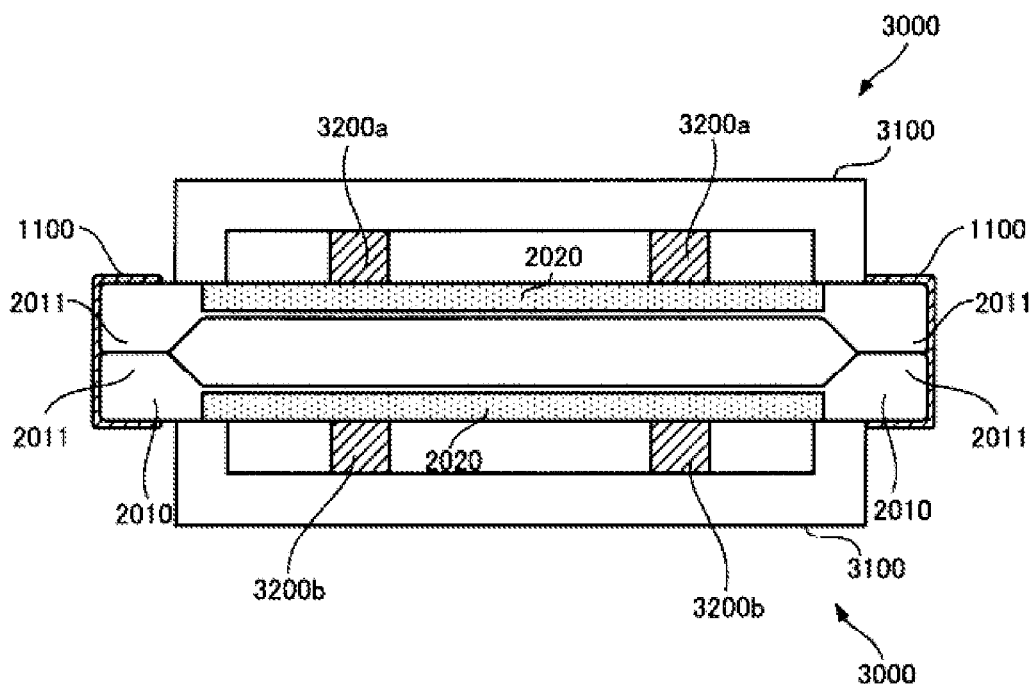

FIGS. 13A and 13B illustrate the step of attaching and plating semiconductor substrates that is carried out during the manufacturing process of a semiconductor device according to Embodiment 6.

FIGS. 13A and 13B are side views of a pair of the semiconductor substrates 2010 that are pressed by a pressing jig 3000.

The structure and configuration of the semiconductor substrates 2010 are the same as those described in Embodiment 4.

As with Embodiment 5, for the semiconductor substrates 2010, a semiconductor device 1000 is formed following the flow chart in FIG. 4. However, in Embodiment 6, the steps from the flow chart in FIG. 11 can be applied to Step S600 in FIG. 4.

First, as indicated by Steps S621 and S622, a pair of aligned semiconductor substrates 2010 are stacked, and the pair of semiconductor substrates 2010 are pressed by the pressing jig 3000 (FIG. 13A).

As in the cases described above, in such a case the pair of semiconductor substrates 2010 are stacked such that outer edge portions 2011 and central regions 2012 thereof face each other, and a cavity is formed between the semiconductor substrates 2010.

Next, as indicated by Step S623, a film 1100 with an adhesive layer can be attached to the outer edges of the semiconductor substrates 2010, which are pressed by the pressing jig 3000, along the outer edges (FIG. 13B).

In this way, the semiconductor substrate 2010 can be used in place of the semiconductor substrate 1010 of Embodiment 5. In addition, as with Embodiment 5, even in cases in which the semiconductor substrate 2010 is used, warps in the semiconductor substrate 2010 can be flattened. The thickness distribution of plating layers formed on the front surface of this semiconductor substrate 2010 was on average 5% for the 50 pairs of semiconductor substrates.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A method of manufacturing a semiconductor device, comprising:
   preparing a pair of substrates each of which includes a device structure on a primary surface, each of the substrates having a rear surface opposite to said primary surface thereof;
   stacking said substrates so that the respective rear surfaces of the substrates face each other, exposing the respective primary surfaces to the outside, and fixing entire peripheral outer edges of the substrates that have been stacked to each other by a fixing member provided at the peripheral outer edges;
   thereafter, plating said exposed primary surfaces of the stacked and fixed substrates;
   thereafter, removing the fixing member to separate the pair of the substrates into two individual substrates each including the device structure; and
   thereafter, dicing each of the two individual substrates into a plurality of chips.

2. The method of manufacturing the semiconductor device according to claim 1, wherein a thickness of said substrates is 30 μm to 200 μm.

3. The method of manufacturing the semiconductor device according to claim 1, wherein, in the step of plating, a plurality of metal layers are stacked on said another primary surfaces.

4. The method of manufacturing the semiconductor device according to claim 1, wherein said plating is electroless plating or electroplating.

5. The method of manufacturing the semiconductor device according to claim 1, wherein the steps of stacking and fixing are performed in a reduced pressure environment, and thereafter, the stacked and fixed substrates are removed from the reduced pressure environment in preparation for the step of plating.

6. The method of manufacturing the semiconductor device according to claim 1, wherein, in the steps of stacking and fixing, said primary surfaces of said substrates are respectively pressed toward each other.

7. The method of manufacturing the semiconductor device according to claim 1, wherein the step of preparing the substrates includes grinding the respective rear surfaces of the respective substrates such that respective central regions of said rear surfaces are ground and respective outer edge sections of said one primary surfaces remain.

8. The method of manufacturing the semiconductor device according to claim 1, wherein said fixing member is a film attached to said entire peripheral outer edges of the respective substrates.

9. The method of manufacturing the semiconductor device according to claim 8, wherein an upper limit temperature of said film is 100° C. or higher.

* * * * *